(12) United States Patent
Kumar et al.

(10) Patent No.: US 8,298,966 B2
(45) Date of Patent: Oct. 30, 2012

(54) ON-CHIP COOLING SYSTEMS FOR INTEGRATED CIRCUITS

(75) Inventors: Kaushik A. Kumar, Beacon, NY (US); Andres Fernando Munoz, Yonkers, NY (US); Michael Ray Sievers, Poughkeepsie, NY (US); Richard Stephen Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 12/698,370

(22) Filed: Feb. 2, 2010

(65) Prior Publication Data

US 2010/0136800 A1 Jun. 3, 2010

Related U.S. Application Data

(62) Division of application No. 11/869,999, filed on Oct. 10, 2007, now Pat. No. 7,659,616.

(51) Int. Cl.
*H01L 21/26* (2006.01)
(52) U.S. Cl. ............... 438/795; 257/E21.328
(58) Field of Classification Search .......... 438/795; 256/E21.328
See application file for complete search history.

(56) References Cited

U.S. PATENT DOCUMENTS

| | | |
|---|---|---|
| 6,022,791 A | 2/2000 | Cook et al. |
| 6,064,118 A | 5/2000 | Sasaki |
| 6,078,088 A | 6/2000 | Buynoski |
| 6,130,151 A | 10/2000 | Lin et al. |
| 6,211,057 B1 | 4/2001 | Lin et al. |
| 6,252,290 B1 | 6/2001 | Quek et al. |
| 6,346,484 B1 | 2/2002 | Cotte et al. |
| 6,576,976 B2 | 6/2003 | Lien et al. |
| 7,091,604 B2 | 8/2006 | Wylie et al. |
| 2005/0026397 A1 | 2/2005 | Daubenspeck et al. |
| 2005/0230350 A1* | 10/2005 | Kao et al. .................. 216/67 |

OTHER PUBLICATIONS

Notice of Allowance (Mail Date Sep. 29, 2009) for U.S. Appl. No. 11/869,999, filed Oct. 10, 2007.

* cited by examiner

*Primary Examiner* — Wael Fahmy
*Assistant Examiner* — Sarah Salerno
(74) *Attorney, Agent, or Firm* — Schmeiser, Olsen & Watts; Joseph Abate (57) ABSTRACT

Structures and methods for forming the same. A semiconductor chip includes a substrate and a transistor. The chip includes N interconnect layers on the substrate, N being a positive integer. The chip includes a cooling pipes system inside the N interconnect layers. The cooling pipes system does not include any solid or liquid material. Given any first point and any second point in the cooling pipes system, there exists a continuous path which connects the first and second points and which is totally within the cooling pipes system. A first portion of the cooling pipes system overlaps the transistor. A second portion of the cooling pipes system is higher than the substrate and lower than a top interconnect layer. The second portion is in direct physical contact with a surrounding ambient.

12 Claims, 10 Drawing Sheets

ON-CHIP COOLING SYSTEMS FOR INTEGRATED CIRCUITS

This application is a divisional application claiming priority to Ser. No. 11/869,999, filed Oct. 10, 2007, now U.S. Pat. No. 7,659,616, issued Feb. 9, 2010.

FIELD OF THE INVENTION

The present invention relates to cooling systems for integrated circuit (chips), and more specifically, to on-chip cooling systems for integrated circuits.

BACKGROUND OF THE INVENTION

In a conventional integrated circuit (chip), the operation of the chip generates a lot of heat. Therefore, there is a need for a cooling system that is different from that of the prior art.

SUMMARY OF THE INVENTION

The present invention provides a semiconductor structure, comprising (a) a semiconductor substrate wherein the semiconductor substrate includes a top substrate surface; (b) a transistor on the semiconductor substrate; (c) N interconnect layers on top of the semiconductor substrate and the transistor, wherein the top substrate surface defines a reference direction perpendicular to the top substrate surface and pointing from the semiconductor substrate to the N interconnect layers, wherein each interconnect layer of the N interconnect layers includes an interlevel dielectric (ILD) layer and a metal line, wherein the metal line is electrically coupled to the transistor, and wherein N is a positive integer; and (d) a cooling pipes system inside the semiconductor structure, wherein the cooling pipes system does not include any solid or liquid material, wherein a first portion of the cooling pipes system is in a top interconnect layer of the N interconnect layers in the reference direction, wherein a second portion of the cooling pipes system is in a next-to-top interconnect layer of the N interconnect layers, wherein the next-to-top interconnect layer is in direct physical contact with the top interconnect layer of the N interconnect layers, wherein given any first point and any second point in the cooling pipes system, there exists a continuous path which connects the first and second points and which is totally within the cooling pipes system, and wherein the first portion of the cooling pipes system is in direct physical contact with a surrounding ambient.

The present invention provides a cooling system that is different from that of the prior art.

DETAILED DESCRIPTION OF THE INVENTION

Figure 1:
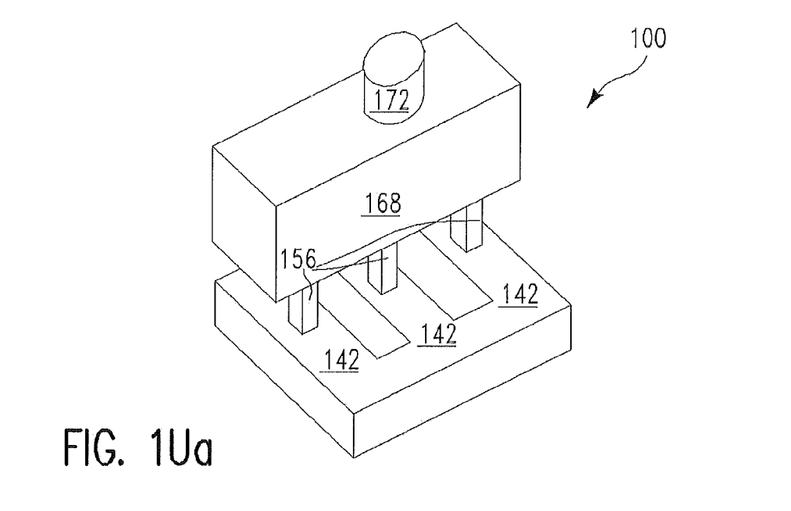
Figure 1A:
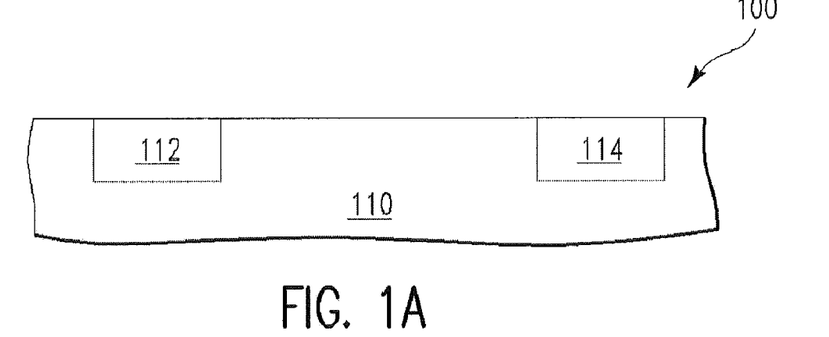
FIGS. 1A-1Ua illustrate a fabrication process for forming a semiconductor chip, in accordance with embodiments of the present invention.
Figure 1B:
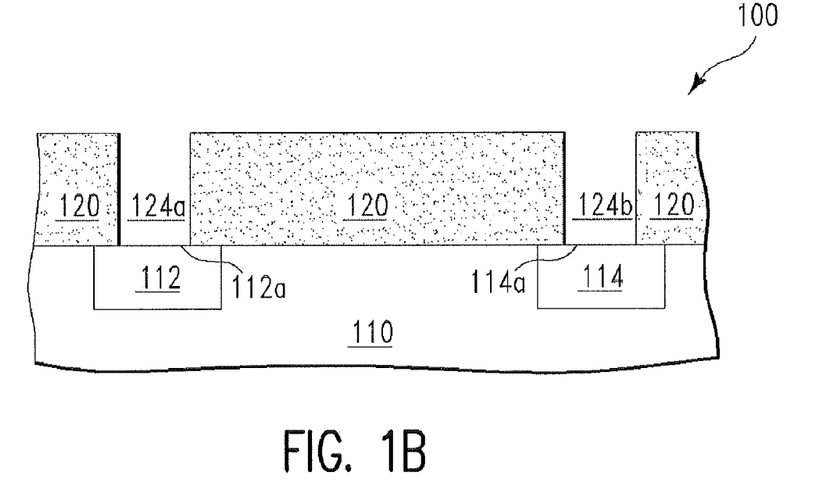
Figure 1C:
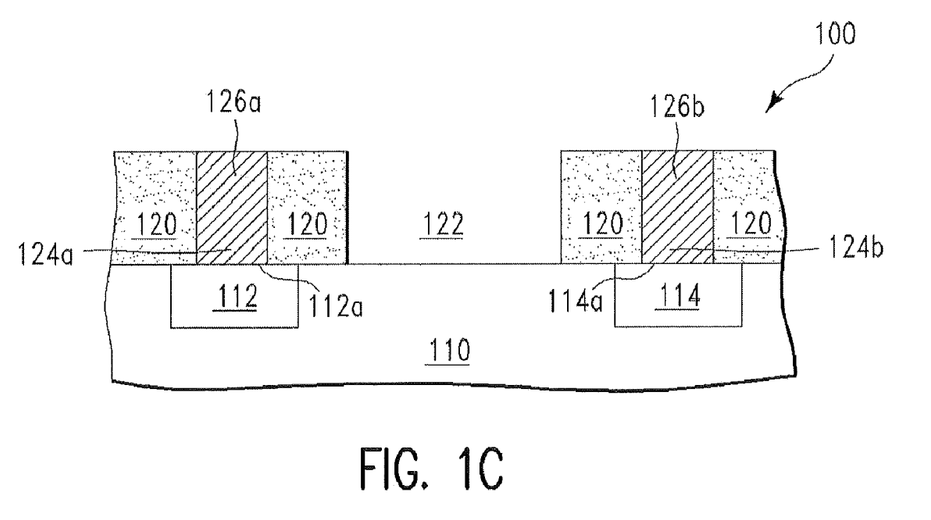
Figure 1D:
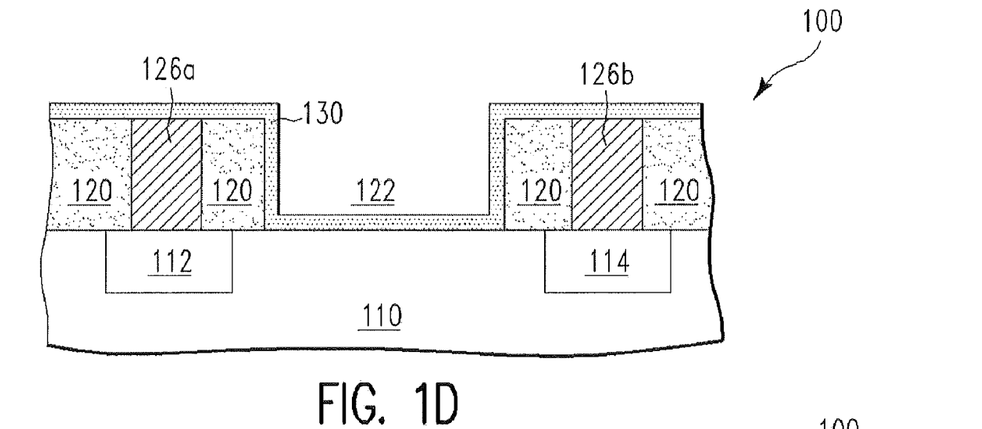
Figure 1E:
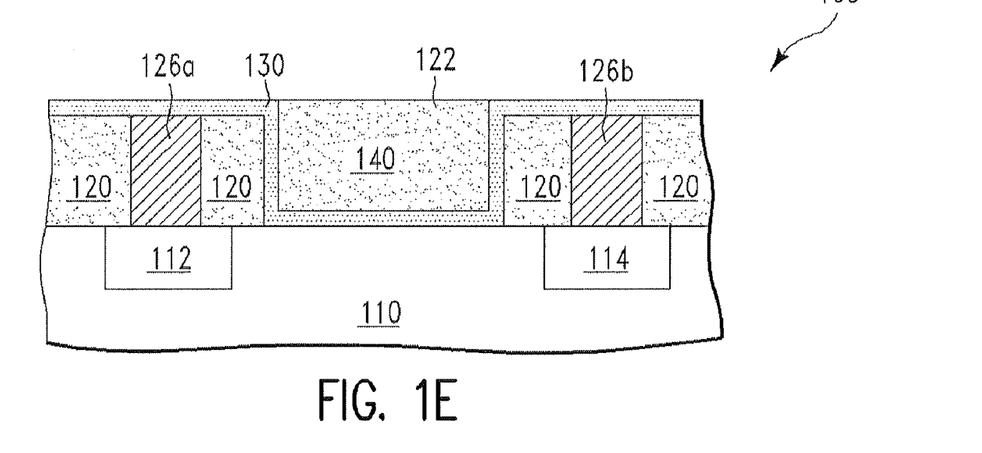
Figure 1F:
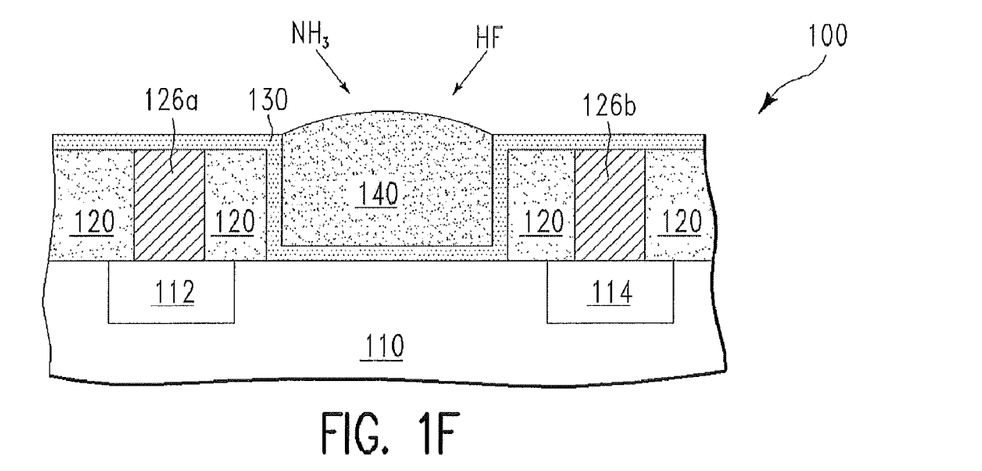
Figure 1G:
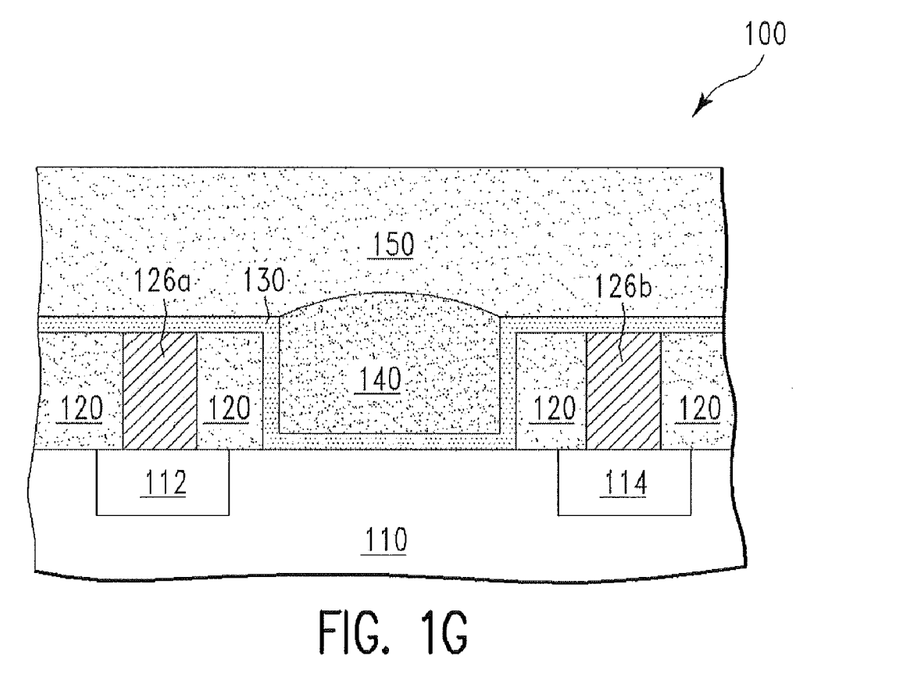
Figure 1H:
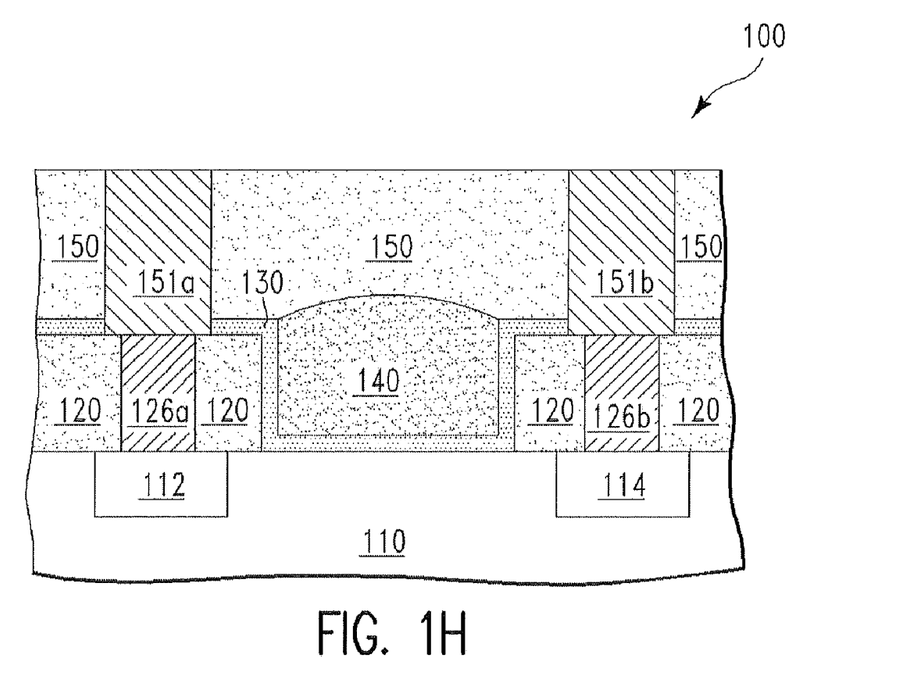
Figure 1I:
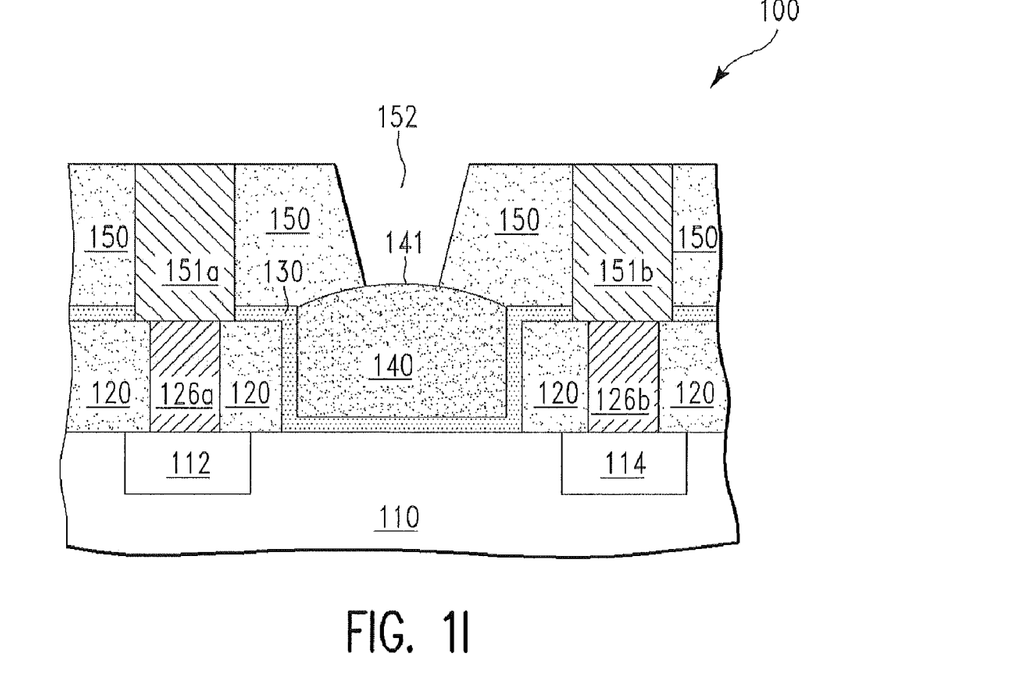
Figure 1J:
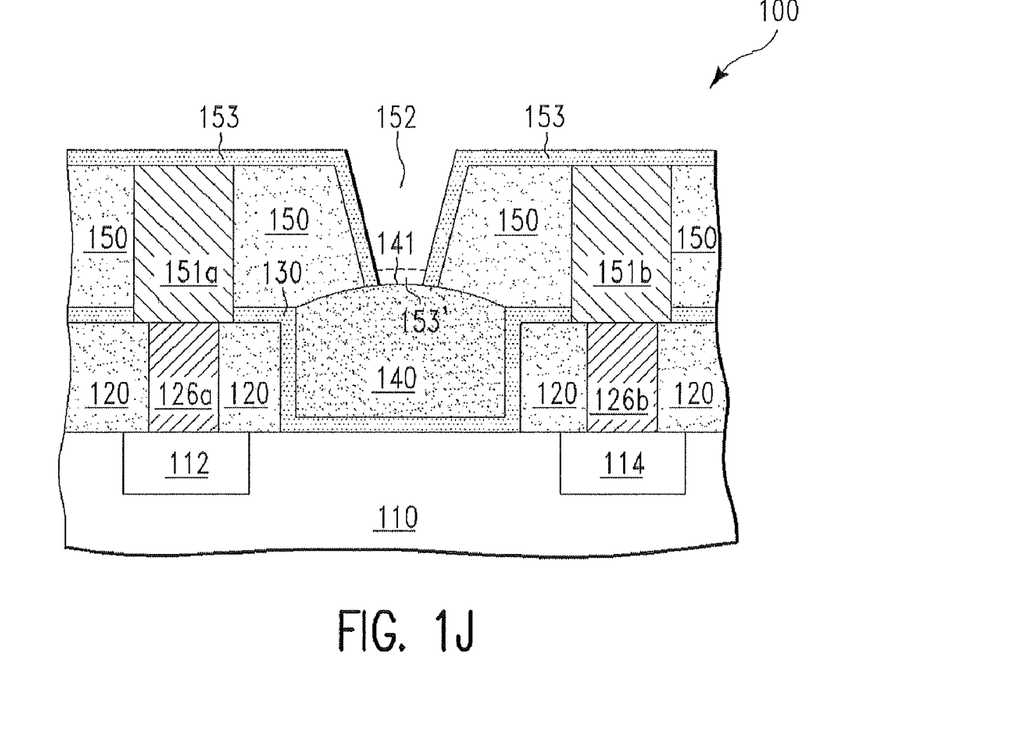
Figure 1K:
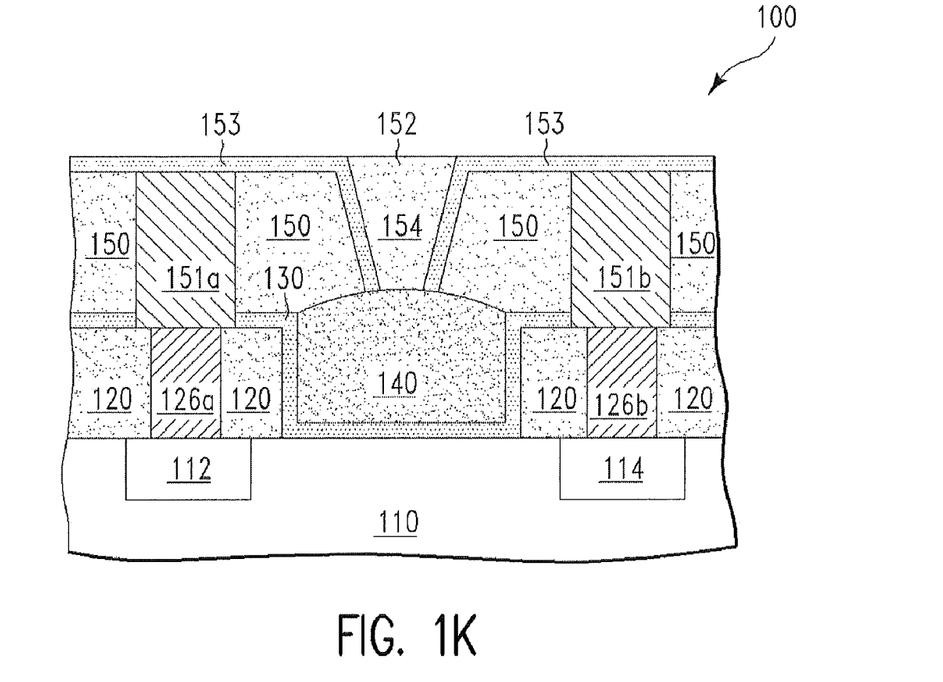
Figure 1L:
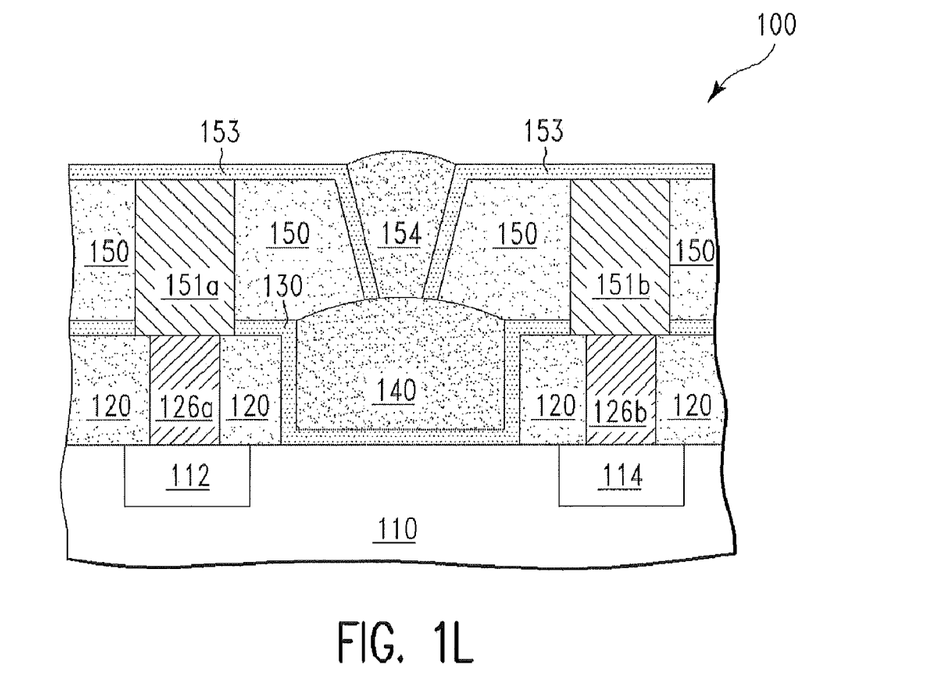
Figure 1M:
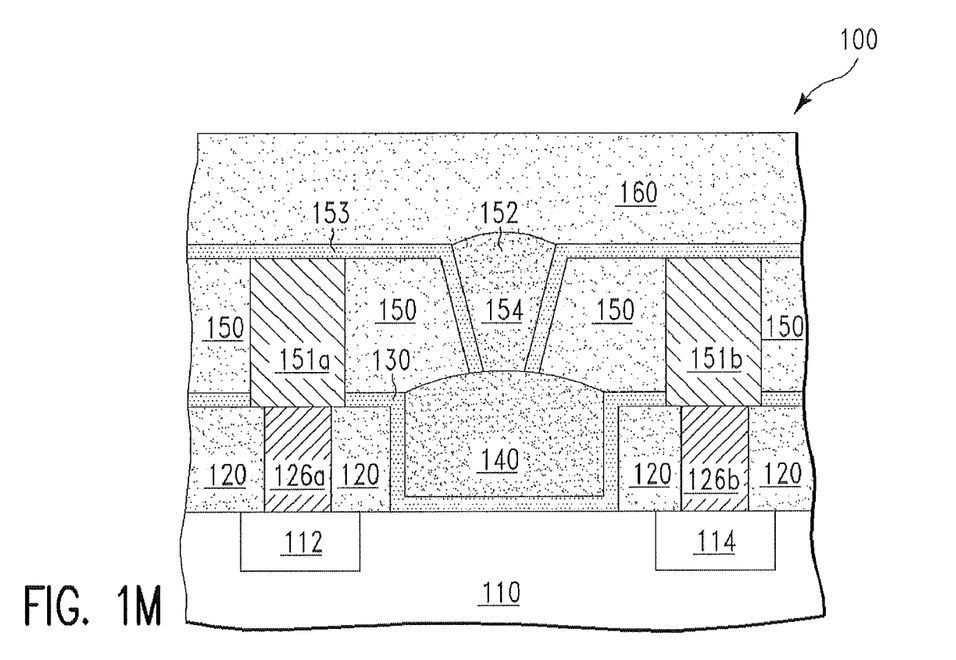
Figure 1N:
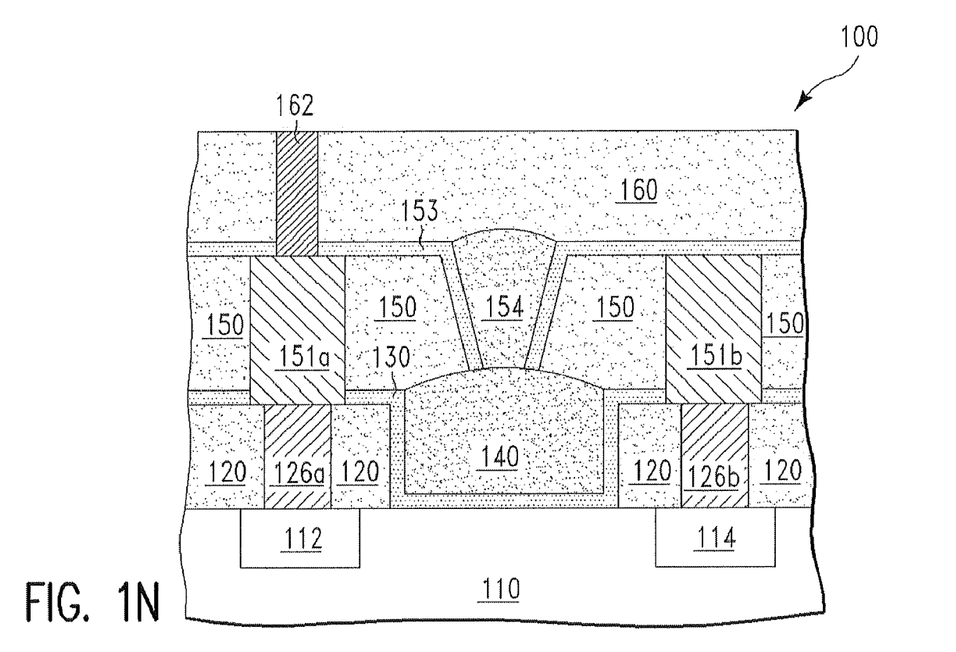
Figure 1O:
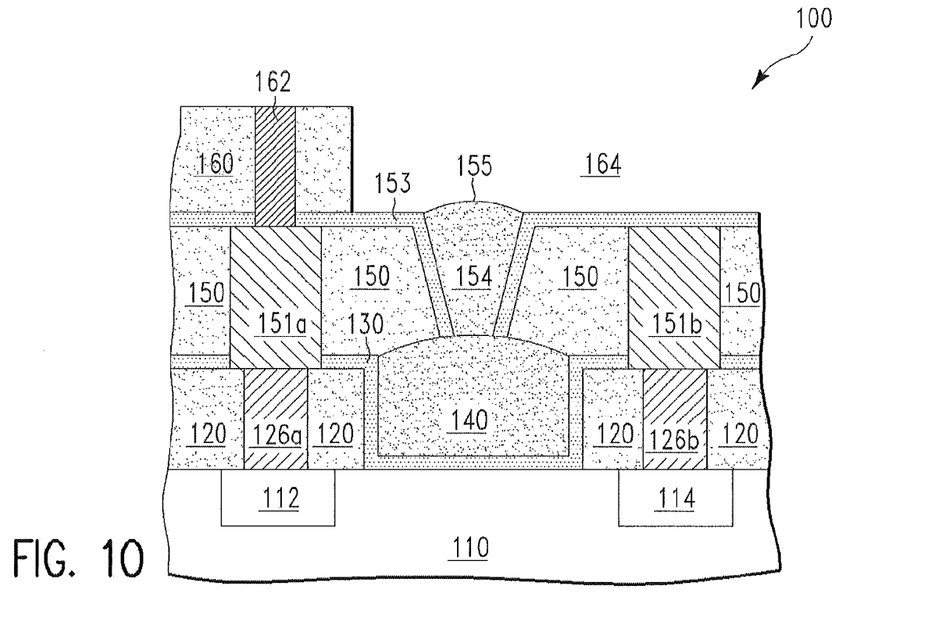
Figure 1P:
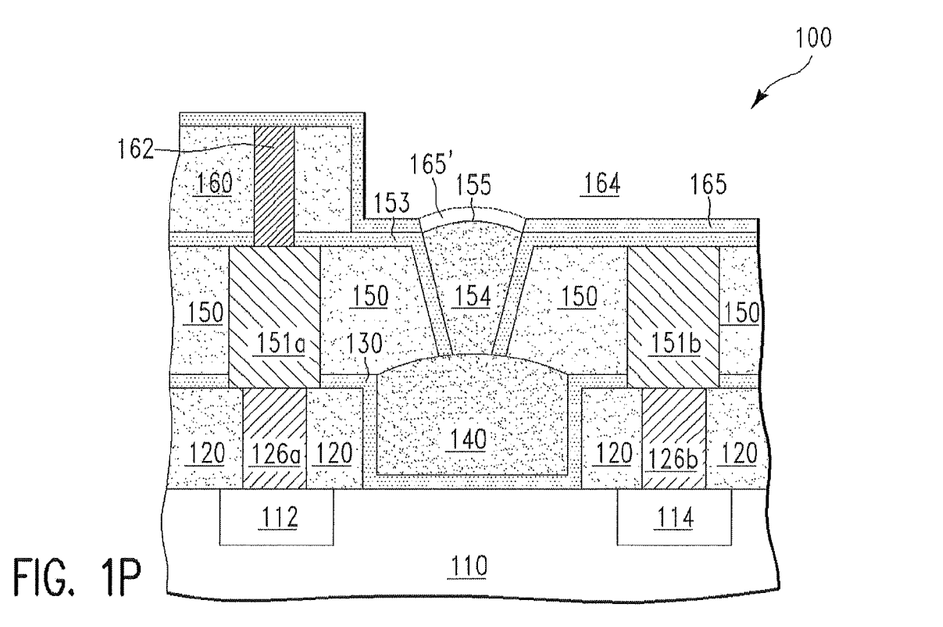
Figure 1Q:
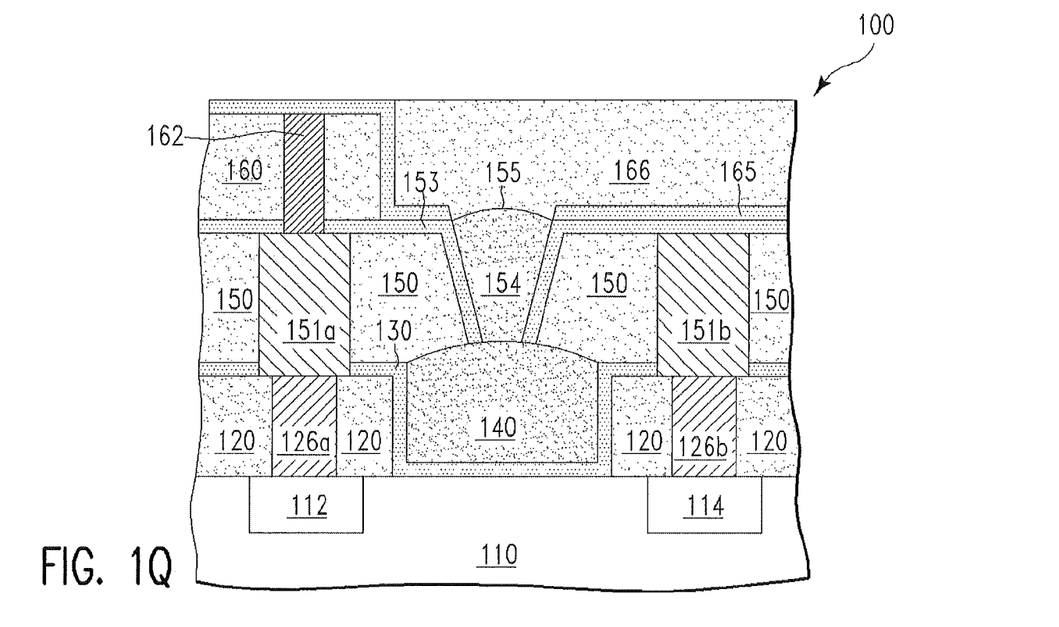
Figure 1R:
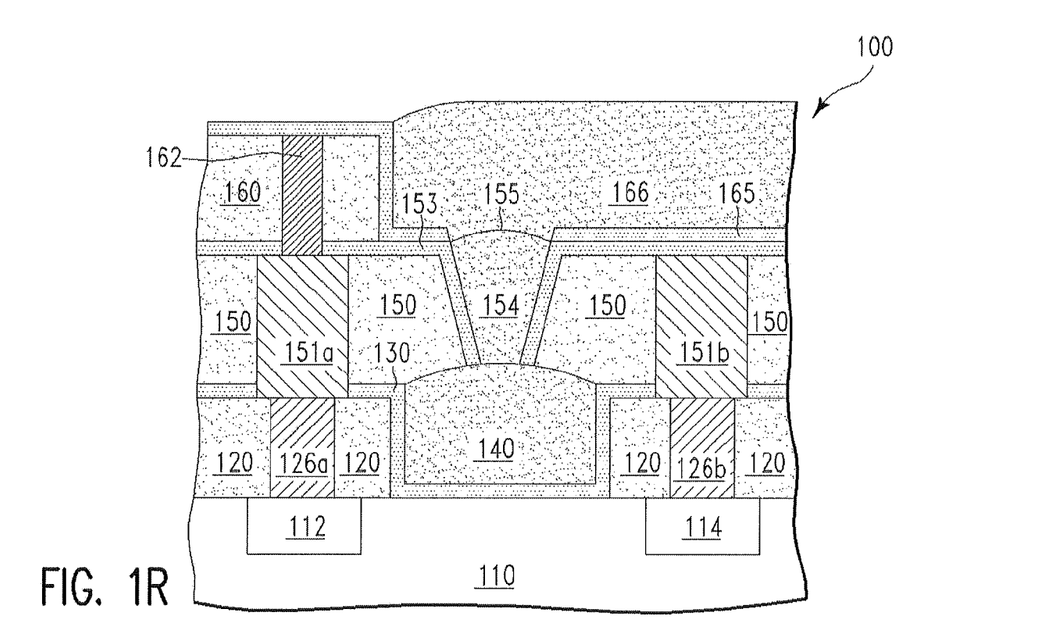
Figure 1S:
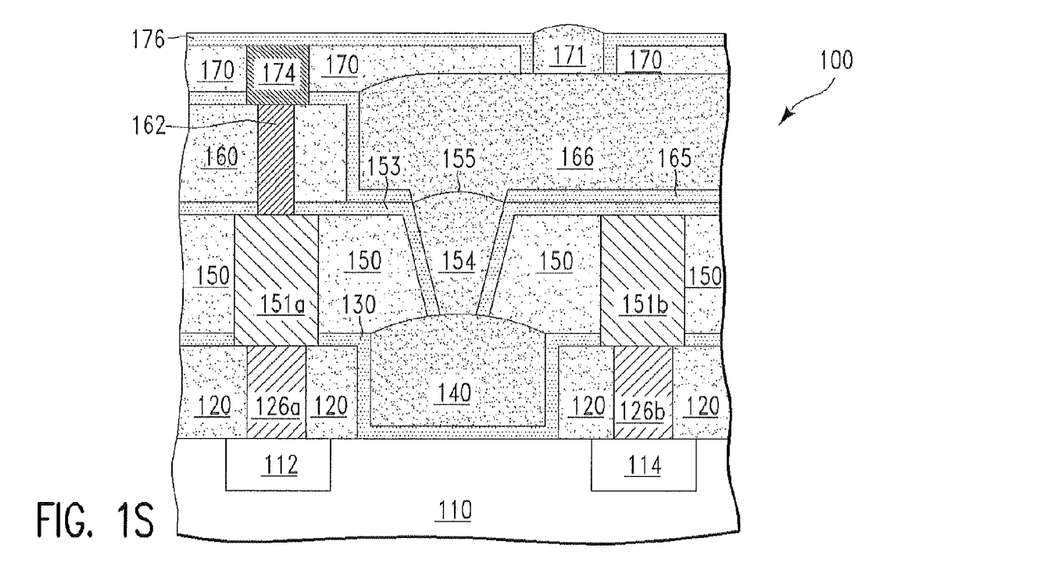
Figure 1T:
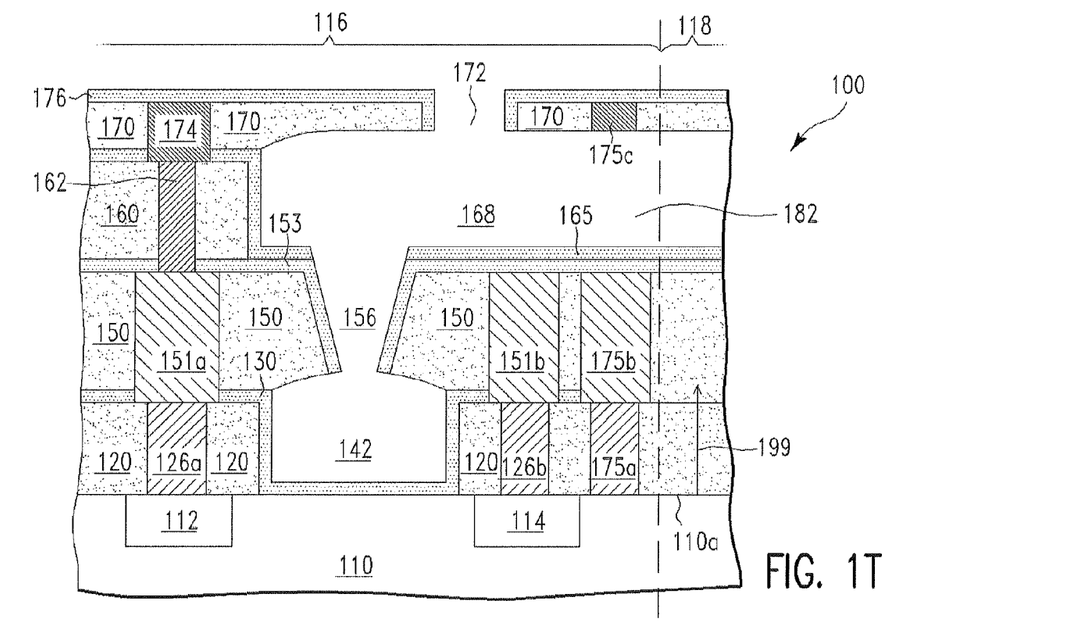
Figure 1U:
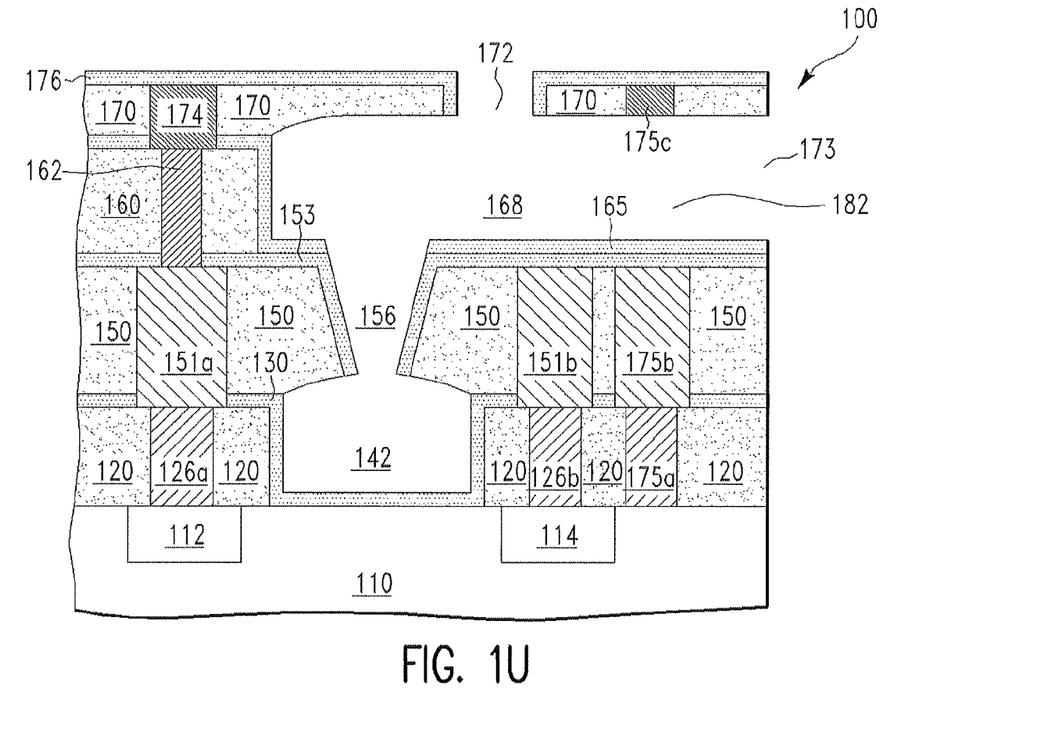

FIGS. 1A-1Ua illustrate a fabrication process for forming a semiconductor chip 100, in accordance with embodiments of the present invention. More specifically, with reference to FIG. 1A (cross-section views), the fabrication process starts with the semiconductor structure 100. The semiconductor structure 100 comprises a semiconductor substrate 110 and transistors (only source/drain regions 112 and 114 of two of the transistors are shown for simplicity) on the semiconductor substrate 110. The transistors are formed on the semiconductor substrate 110 by using conventional methods.

Next, with reference to FIG. 1B, in one embodiment, a dielectric layer 120 is formed on top of the structure 100 of FIG. 1A. The dielectric layer 120 can comprise BPSG (Boro-Phospho-Silicate Glass). If BPSG is used, the dielectric layer 120 can be formed by CVD (Chemical Vapor Deposition) of BPSG on top of the semiconductor substrate 110 and the source/drain regions 112 and 114, followed by a CMP (Chemical Mechanical Polishing) step.

Next, in one embodiment, contact holes 124a and 124b are created in the dielectric layer 120 such that top surfaces 112a and 114a of the source/drain regions 112 and 114, respectively, are exposed to the surrounding ambient through the contact holes 124a and 124b, respectively. The contact holes 124a and 124b can be formed by using conventional lithographic and etching processes.

Next, with reference to FIG. 1C, in one embodiment, contact regions 126a and 126b are formed in the contact holes 124a and 124b, respectively, such that the contact regions 126a and 126b are electrically coupled to the source/drain regions 112 and 114, respectively. The contact regions 126a and 126b can comprise tungsten. The contact regions 126a and 126b can be formed by using a conventional method. In one embodiment, before the contact regions 126a and 126b are formed, thin metal (e.g., titanium nitride) liner layers (not shown) are formed on side walls and bottom walls of the contact holes 124a and 124b, followed by the formation of the contact regions 126a and 126b in the contact holes 124a and 124b, respectively.

Next, in one embodiment, a trench 122 is created on the dielectric layer 120 such that a top surface 110a of the semiconductor substrate 110 is exposed to the surrounding ambient through the trench 122. The trench 122 can be formed by using conventional lithographic and etching processes.

Next, with reference to FIG. 1D, in one embodiment, a first conformal dielectric isolation layer 130 is formed on top of the entire structure 100 of FIG. 1C. The first conformal dielectric isolation layer 130 can comprise silicon nitride. If silicon nitride is used, the first conformal dielectric isolation layer 130 can be formed by CVD of silicon nitride on top of the structure 100 of FIG. 1C (including on side walls and a bottom wall of the trench 122).

Next, with reference to FIG. 1E, in one embodiment, a first initial filling region 140 is formed in the trench 122. The first initial filling region 140 can comprise an initial filling material such as silicon dioxide. If silicon dioxide is used, the first initial filling region 140 can be formed by CVD of silicon dioxide on top of the entire structure 100 of FIG. 1D (including in the trench 122), followed by a CMP step to remove the excessive silicon dioxide outside the trench 122. It should be noted that the first conformal dielectric isolation layer 130 physically separates the first initial filling region 140 from the dielectric layer 120 and the semiconductor substrate 110.

Next, in one embodiment, the initial filling material (silicon dioxide) of the first initial filling region 140 is converted to a temporary filling material as shown in FIG. 1F. More specifically, the initial filling material (silicon dioxide) is exposed to hydro fluoric (HF) and ammonia ($NH_3$) gasses, resulting in chemical reactions between the HF gasses, $NH_3$ gasses, and the initial filling material (silicon dioxide). The chemical reactions between the HF gasses, $NH_3$ gasses, and the initial filling material (silicon dioxide) result in the temporary filling material (ammonium hexafluorosilicate ($NH_4)_2$ $SiF_6$), according to the following chemical reaction equations:

$$SiO_2+4HF=SiF_4+2H_2O, \quad (1) \text{ and}$$

$$SiF_4+2NH_3+2HF=(NH_4)_2SiF_6 \quad (2)$$

Because of the material conversion, the region 140 can be hereafter referred to as the first temporary filling region 140. It should be noted that the volume of the first temporary filling region 140 is larger than earlier due to the conversion of the initial filling material (silicon dioxide) to the temporary filling material ($(NH_4)_2SiF_6$).

Next, with reference to FIG. 1G, in one embodiment, an interlevel dielectric (ILD) layer 150 is formed on top of the structure 100 of FIG. 1F. The ILD layer 150 can comprise silicon dioxide. If silicon dioxide is used, the ILD layer 150 can be formed by CVD of silicon dioxide on top of the entire structure 100 of FIG. 1F, followed by a CMP step.

Next, with reference to FIG. 1H, in one embodiment, metal lines 151a and 151b are formed in the ILD layer 150 such that the metal lines 151a and 151b are electrically coupled to the contact regions 126a and 126b, respectively. The metal lines 151a and 151b can comprise copper. The copper lines 151a and 151b can be formed by using a conventional method. In one embodiment, there are thin metal (e.g., tantalum nitride) liner layers (not shown) on side walls and bottom walls of the copper lines 151a and 151b so as to prevent copper of the copper lines 151a and 151b from diffusing into the surrounding dielectric material of the ILD layer 150. The ILD layer 150 and the metal lines 151a and 151b can be collectively referred to as an interconnect layer 150+151.

Next, with reference to FIG. 1I, in one embodiment, a hole 152 is created in the ILD layer 150 such that a top surface 141 of the first temporary filling region 140 is exposed to the surrounding ambient through the hole 152. The hole 152 can be formed by using conventional lithographic and etching processes.

Next, with reference to FIG. 1J, in one embodiment, a second conformal dielectric isolation layer 153 is formed on top of the entire structure 100 of FIG. 1I. The second conformal dielectric isolation layer 153 can comprise silicon nitride. If silicon nitride is used, the second conformal dielectric isolation layer 153 can be formed by CVD of silicon nitride on top of the structure 100 of FIG. 1I (including on side walls and a bottom wall of the hole 152).

Next, in one embodiment, a dielectric portion 153' (on top of the top surface 141 of the first temporary filling region 140) of the second conformal dielectric isolation layer 153 is removed such that the top surface 141 of the first temporary filling region 140 is exposed to the surrounding ambient through the hole 152. The dielectric portion 153' can be removed by using conventional lithographic and etching processes, resulting in the second conformal dielectric isolation layer 153 as shown in FIG. 1J.

Next, with reference to FIG. 1K, in one embodiment, a second initial filling region 154 is formed in the hole 152 such that the second initial filling region 154 is in direct physical contact with the first temporary filling region 140. The second initial filling region 154 can comprise the initial filling material (silicon dioxide). If silicon dioxide is used, the second initial filling region 154 can be formed by CVD of silicon dioxide on top of the entire structure 100 of FIG. 1J (including in the hole 152), followed by a CMP step to remove the excessive silicon dioxide outside the hole 152. It should be noted that the second conformal dielectric isolation layer 153 physically separates the second initial filling region 154 and the ILD layer 150.

Next, in one embodiment, the initial filling material (silicon dioxide) of the second initial filling region 154 is converted to the temporary filling material ($(NH_4)_2SiF_6$) as shown in FIG. 1L. More specifically, the conversion from the initial filling material to the temporary filling material is performed according to the same chemical reaction equations (1) and (2) above.

Because of the material conversion, the region 154 can be hereafter referred to as the second temporary filling region 154. It should be noted that the volume of the second temporary filling region 154 is larger than earlier due to the conversion from the initial filling material (silicon dioxide) to the temporary filling material ($(NH_4)_2SiF_6$).

Next, with reference to FIG. 1M, in one embodiment, an ILD layer 160 is formed on top of the structure 100 of FIG. 1L. The ILD layer 160 can comprise silicon dioxide. If silicon dioxide is used, the ILD layer 160 can be formed by CVD of silicon dioxide on top of the entire structure 100 of FIG. 1L, followed by a CMP step.

Next, with reference to FIG. 1N, in one embodiment, a metal via 162 is formed in the ILD layer 160 such that the metal via 162 is electrically coupled to the copper line 151a. The metal via 162 can comprise copper. The copper via 162 can be formed by using a conventional method. In one embodiment, there are thin metal (e.g., tantalum nitride) liner layers (not shown) on side walls and bottom walls of the copper via 162 so as to prevent copper of the copper via 162 from diffusing out of the copper via 162.

Next, with reference to FIG. 1O, in one embodiment, a trench 164 is created in the ILD layer 160 such that a top surface 155 of the second temporary filling region 154 is exposed to the surrounding ambient through the trench 164. The trench 164 can be formed by using conventional lithographic and etching processes.

Next, with reference to FIG. 1P, in one embodiment, a third conformal dielectric isolation layer 165 is formed on top of the entire structure 100 of FIG. 1O. The third conformal dielectric isolation layer 165 can comprise silicon nitride. If silicon nitride is used, the third conformal dielectric isolation layer 165 can be formed by CVD of silicon nitride on top of the structure 100 of FIG. 1O (including on side walls and a bottom wall of the trench 164).

Next, in one embodiment, a dielectric portion 165' (on top of the top surface 155 of the second temporary filling region 154) of the third conformal dielectric isolation layer 165 is removed such that the top surface 155 of the second temporary filling region 154 is exposed to the surrounding ambient through the trench 164. The dielectric portion 165' can be removed by using conventional lithographic and etching processes, resulting in the third conformal dielectric isolation layer 165 as shown in FIG. 1P.

Next, with reference to FIG. 1Q, in one embodiment, a third initial filling region 166 is formed in the trench 164 such that the third initial filling region 166 is in direct physical contact with the second temporary filling region 154. The third initial filling region 166 can comprise the initial filling material (silicon dioxide). If silicon dioxide is used, the third initial filling region 166 can be formed by CVD of silicon dioxide on top of the entire structure 100 of FIG. 1P (including in the trench 164), followed by a CMP step to remove the excessive silicon dioxide outside the trench 164. It should be noted that the third conformal dielectric isolation layer 165 physically separates the third initial filling region 166 and the ILD layer 160.

Next, in one embodiment, the initial filling material (silicon dioxide) of the third initial filling region 166 is converted to the temporary filling material ($(NH_4)_2SiF_6$) as shown in FIG. 1R. More specifically, the conversion from the initial filling material to the temporary filling material is performed according to the same chemical reaction equations (1) and (2) above.

Because of the material conversion, the region 166 can be hereafter referred to as the third temporary filling region 166. It should be noted that the volume of the third temporary filling region 166 is larger than earlier due to the conversion from the initial filling material (silicon dioxide) to the temporary filling material (($NH_4$)$_2$$SiF_6$).

Next, with reference to FIG. 1S, in a manner similar to what is described in FIGS. 1G-1L, an ILD layer 170, a copper line 174, a fourth temporary filling region 171, and a fourth conformal dielectric isolation layer 176 are formed. The ILD layer 160, the metal via 162, the ILD layer 170, and the copper line 174 can be collectively referred to as an interconnect layer 160+170.

Next, in one embodiment, other interconnect layers, and temporary filling regions (not shown for simplicity, but similar to the interconnect layer 160+170 and the fourth temporary filling region 171, respectively) are formed on top of the structure 100 of FIG. 1S. These temporary filling regions and the first, second, third, and fourth temporary filling regions 140, 154, 166, and 171 form a continuous temporary filling region 180 such that given any first point and any second point in the continuous temporary filling region 180, there exists a continuous path which connects the first and second points and which is totally within the continuous temporary filling region 180. In one embodiment, the continuous temporary filling region 180 overlaps the source/drain region 114 in a reference direction 199 (which is perpendicular to the top surface 110a of the semiconductor substrate 110).

Next, in one embodiment, the continuous temporary filling region 180 (including the first, second, third, and fourth temporary filling regions 140, 154, 166, and 171) is completely removed, resulting in a cooling pipes system 182 (including cooling pipes 142, 156, 168, and 172) in FIG. 1T. The cooling pipes system 182 can comprise spaces which do not contain any solid or liquid material. The cooling pipes system 182 can contain gasses or vapors or oxygen and nitrogen of the atmosphere, etc. More specifically, the continuous temporary filling region 180 (including the first, second, third, and fourth temporary filling regions 140, 154, 166, and 171) can be removed by heating up the semiconductor chip 100 of FIG. 1S to a high temperature (from 150° C.-200° C.), resulting in the temporary filling material (($NH_4$)$_2$$SiF_6$) of the continuous temporary filling region 180 evaporating. It should be noted that the temporary filling material (($NH_4$)$_2$$SiF_6$) has a characteristic of turning into gasses at high temperatures (from 150° C.-200° C.). In one embodiment, the cooling pipes system 182 leads to the surrounding ambient through a cooling pipe 172 in the top ILD layer 170 (assume that the ILD layer 170 is the top layer of the structure 100).

In one embodiment, as shown in FIG. 1T, the structure 100 comprises a chip region 116 and a dicing channel region 118, which are separated by a dashed line. It should be noted that the structure 100 comprises a crack stop region 175a+175b+175c (shown in FIG. 1T but not shown in FIGS. 1A-1S for simplicity). The crack stop region 175a+175b+175c can comprise copper. The crack stop region 175a+175b+175c can be formed by using a conventional method. Next, other conventional fabrication processes (forming solder bumps, etc.) can be performed on the structure 100, resulting in the complete semiconductor chip 100. The crack stop region 175a+175b+175c forms a closed loop on the perimeter of the chip 100. The presence of the crack stop region 175a+175b+175c prevents cracks (if any) from propagating from the dicing channel region 118 to the center of the chip 100 during a chip dicing process.

Next, in one embodiment, the chip dicing process is performed wherein a blade (not shown) can be used to cut through the dicing channel region 118, resulting in the separated semiconductor chip 100 in FIG. 1U. In one embodiment, the cooling pipe 168 of the cooling pipes system 182 goes through the crack stop region 175a+175b+175c and leads to the surrounding ambient through a portion 173 of the cooling pipes system 182. It should be noted that the portion 173 of the cooling pipes system 182 is in direct physical contact with the surrounding ambient.

During the operation of the chip 100, heat generated from the source/drain regions 112 and 114 of the chip 100 can be carried out to the surrounding ambient through the cooling pipes system 182. In general, heat generated by the operation of the transistors of the chip 100 can be carried out to the surrounding ambient through the cooling pipes system 182. In one embodiment, some electrically conductive regions (such as an electrically conductive region 175c) of the chip 100 are in direct physical contact with the cooling pipes system 182. In other words, the electrically conductive regions are exposed on side walls of the cooling pipes system 182. In an alternative embodiment, no electrically conductive region of the chip 100 is in direct physical contact with the cooling pipes system 182.

FIG. 1Ua shows a perspective view of the cooling pipes system 182 (including the cooling pipes 142, 156, 168, and 172) of FIG. 1U, but only the cooling pipes 142, 156, 168, and 172 are shown. In one embodiment, the cooling pipes system 182 is a continuous cooling pipes system such that given any first point and any second point in the cooling pipes system 182, there exists a continuous path which connects the first and second points and which is totally within the cooling pipes system 182. The cooling pipes system 182 (including the cooling pipes 142, 156, 168, and 172) helps cool down the semiconductor chip 100 during the operation of the chip 100 by carrying the heat generated by the operation of the chip 100 to the surrounding ambient through cooling pipes such as the portion 173 in FIG. 1U.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising:
   providing a structure which includes:
   (a) a semiconductor substrate wherein the semiconductor substrate includes a top substrate surface,
   (b) a transistor on the semiconductor substrate,
   (c) N interconnect layers on top of the semiconductor substrate and the transistor,
      wherein the top substrate surface defines a reference direction perpendicular to the top substrate surface and pointing from the semiconductor substrate to the N interconnect layers,
      wherein each interconnect layer of the N interconnect layers includes an interlevel dielectric (ILD) layer and a metal line,
   wherein the metal line is electrically coupled to the transistor, and
      wherein N is a positive integer, and (d) a temporary filling region inside the semiconductor structure,
  wherein the temporary filling region comprises a temporary filling material; and
heating the temporary filling region at a high temperature, resulting in a cooling pipes system in place of the temporary filling region,
  wherein the cooling pipes system does not include any solid or liquid material,
  wherein a first portion of the cooling pipes system is in a top interconnect layer of the N interconnect layers in the reference direction,
  wherein a second portion of the cooling pipes system is in a next-to-top interconnect layer of the N interconnect layers,
  wherein the next-to-top interconnect layer is in direct physical contact with the top interconnect layer of the N interconnect layers,
  wherein given any first point and any second point in the cooling pipes system, there exists a continuous path which connects the first and second points and which is totally within the cooling pipes system,
  wherein the first portion of the cooling pipes system is in direct physical contact with a surrounding ambient,
  wherein the first portion of the cooling pipes system is in direct physical contact with the surrounding ambient at a first interface between the first portion of the cooling pipes system and the ambient such that the first reference direction is perpendicular to the first interface,
  wherein the second portion of the cooling pipes system is in direct physical contact with the surrounding ambient at a second interface between the second portion of the cooling pipes system and the ambient such that a second reference direction is perpendicular to the second interface,
  wherein the second reference direction is perpendicular to the first reference direction, and
  wherein a totality of interfaces between the cooling pipes system and the ambient consists of the first interface and the second interface.

2. The method of claim 1, wherein the temporary filling material comprises ammonium hexafluorosilicate $(NH_4)_2SiF_6$.

3. The method of claim 1, wherein the high temperature is in a range of 150° C.-200° C.

4. The method of claim 1, wherein said heating the temporary filling region at the high temperature results in the temporary filling region evaporating.

5. The method of claim 1, wherein said providing the structure comprises:
  forming the semiconductor substrate, then
  forming the transistor on the semiconductor substrate, then
  forming the N interconnect layers on top of the semiconductor substrate and the transistor,
  forming an initial filling region inside the semiconductor structure, wherein the initial filling region comprises an initial filling material, and
  converting the initial filling material into the temporary filling material, resulting in the initial filling region becoming the temporary filling region.

6. The method of claim 5, wherein the initial filling material comprises silicon dioxide.

7. The method of claim 5, wherein said converting comprises exposing the initial filling material to hydro fluoric (HF) and ammonia ($NH_3$) gasses, resulting in chemical reactions between the HF gasses, $NH_3$ gasses, and the initial filling material, thereby, converting the initial filling material into the temporary filling material.

8. A semiconductor structure fabrication method, comprising:
  providing a structure which includes:
    (a) a semiconductor substrate wherein the semiconductor substrate includes a top substrate surface,
    (b) a transistor on the semiconductor substrate,
    (c) N interconnect layers on top of the semiconductor substrate and the transistor,
      wherein the top substrate surface defines a reference direction perpendicular to the top substrate surface and pointing from the semiconductor substrate to the N interconnect layers,
      wherein each interconnect layer of the N interconnect layers includes an interlevel dielectric (ILD) layer and a metal line,
      wherein the metal line is electrically coupled to the transistor, and
      wherein N is a positive integer, and
    (d) a temporary filling region inside the semiconductor structure,
      wherein the temporary filling region comprises a temporary filling material; and
  heating the temporary filling region at a high temperature, resulting in a cooling pipes system in place of the temporary filling region,
    wherein the cooling pipes system does not include any solid or liquid material,
    wherein given any first point and any second point in the cooling pipes system, there exists a continuous path which connects the first and second points and which is totally within the cooling pipes system,
    wherein a first portion of the cooling pipes system overlaps the transistor in the reference direction,
    wherein a second portion of the cooling pipes system is higher than the semiconductor substrate and lower than a top interconnect layer of the N interconnect layers in the reference direction,
    wherein the second portion of the cooling pipes system is in direct physical contact with a surrounding ambient,
    wherein the first portion of the cooling pipes system is in direct physical contact with the surrounding ambient at a first interface between the first portion of the cooling pipes system and the ambient such that the first reference direction is perpendicular to the first interface,
    wherein the second portion of the cooling pipes system is in direct physical contact with the surrounding ambient at a second interface between the second portion of the cooling pipes system and the ambient such that a second reference direction is perpendicular to the second interface,
    wherein the second reference direction is perpendicular to the first reference direction, and
    wherein a totality of interfaces between the cooling pipes system and the ambient consists of the first interface and the second interface.

9. The method of claim 8, wherein the temporary filling material comprises ammonium hexafluorosilicate $(NH_4)_2SiF_6$.

10. The method of claim 8, wherein said heating the temporary filling region at the high temperature results in the temporary filling region evaporating.

11. The method of claim 8, wherein said providing the structure comprises:
  forming the semiconductor substrate, then
  forming the transistor on the semiconductor substrate, then
  forming the N interconnect layers on top of the semiconductor substrate and the transistor,
  forming an initial filling region inside the semiconductor structure, wherein the initial filling region comprises an initial filling material, and converting the initial filling material into the temporary filling material, resulting in the initial filling region becoming the temporary filling region.

12. A semiconductor structure fabrication method, comprising:
  providing a structure which includes:
  (a) a semiconductor substrate wherein the semiconductor substrate includes a top substrate surface,
  (b) a transistor on the semiconductor substrate,
  (c) N interconnect layers on top of the semiconductor substrate and the transistor,
    wherein the top substrate surface defines a reference direction perpendicular to the top substrate surface and pointing from the semiconductor substrate to the N interconnect layers,
    wherein each interconnect layer of the N interconnect layers includes an interlevel dielectric (ILD) layer and a metal line,
    wherein the metal line is electrically coupled to the transistor, and
    wherein N is a positive integer, and
  (d) a temporary filling region inside the semiconductor structure,
    wherein the temporary filling region comprises a temporary filling material; and
  heating the temporary filling region at a high temperature, resulting in a cooling pipes system in place of the temporary filling region,
    wherein the cooling pipes system does not include any solid or liquid material,
    wherein a first portion of the cooling pipes system is in a top interconnect layer of the N interconnect layers in the reference direction,
    wherein a second portion of the cooling pipes system is in a next-to-top interconnect layer of the N interconnect layers,
    wherein the next-to-top interconnect layer is in direct physical contact with the top interconnect layer of the N interconnect layers,
    wherein given any first point and any second point in the cooling pipes system, there exists a continuous path which connects the first and second points and which is totally within the cooling pipes system,
    wherein the first portion of the cooling pipes system is in direct physical contact with a surrounding ambient,
    wherein the temporary filling material comprises ammonium hexafluorosilicate $(NH_4)_2SiF_6$,
    wherein said heating the temporary filling region at the high temperature results in the temporary filling region evaporating,
    wherein no electrically conductive region of the semiconductor structure is in direct physical contact with the cooling pipes system,
    wherein the first portion of the cooling pipes system is in direct physical contact with the surrounding ambient at a first interface between the first portion of the cooling pipes system and the ambient such that the first reference direction is perpendicular to the first interface,
    wherein the second portion of the cooling pipes system is in direct physical contact with the surrounding ambient at a second interface between the second portion of the cooling pipes system and the ambient such that a second reference direction is perpendicular to the second interface,
    wherein the second reference direction is perpendicular to the first reference direction, and
    wherein a totality of interfaces between the cooling pipes system and the ambient consists of the first interface and the second interface.

\* \* \* \* \*